United States Patent [19]
Erickson

[11] Patent Number: 4,928,788
[45] Date of Patent: May 29, 1990

[54] PORTED AUTOMOTIVE SPEAKER ENCLOSURE APPARATUS AND METHOD

[76] Inventor: Jon B. Erickson, 112 Kaibab Way, Cochise, Ariz. 85606

[21] Appl. No.: 364,160

[22] Filed: Jun. 12, 1989

[51] Int. Cl.[5] .......... H05K 5/00
[52] U.S. Cl. .......... 181/141; 181/148; 181/150; 181/156; 181/296; 381/86
[58] Field of Search .......... 181/141, 148, 150, 151, 181/155, 156, 296; 381/86

[56] References Cited

U.S. PATENT DOCUMENTS

| | | | |
|---|---|---|---|
| 3,993,345 | 11/1976 | Croup | 181/150 X |
| 4,006,311 | 2/1977 | Carlsson | 181/147 X |
| 4,090,582 | 5/1978 | Deschu | 181/150 |
| 4,134,471 | 10/1977 | Queen | 181/147 |
| 4,284,166 | 8/1991 | Gale | 181/156 |
| 4,398,619 | 8/1983 | Daniel | 181/156 |
| 4,635,748 | 1/1987 | Paulson | 181/145 |
| 4,785,908 | 11/1988 | Rothenberg | 181/156 |

FOREIGN PATENT DOCUMENTS

| | | | |
|---|---|---|---|
| 3028610 | 2/1982 | Fed. Rep. of Germany | 381/24 |
| 8200543 | 2/1982 | Int'l Pat. Institute | 181/151 |

*Primary Examiner*—Benjamin R. Fuller

*Attorney, Agent, or Firm*—Victor Flores

[57] ABSTRACT

The present invention discloses a ported reflex speaker enclosure for use in the automotive audio systems industry. The ported reflex speaker enclosure is a design that factors the audio and thermal design considerations as found in the automotive operating environment as well as factoring the audio and mechanical mounting considerations as found in the automobile audio systems. The ported reflex speaker enclosure is primarily intended for six (6) by nine (9) inch standard speaker chassis used in automotive audio systems that typically are found as non-enclosed suspended speakers in the trunk compartment of automobiles. The speaker enclosure is a concave body having an oval shaped rim portion for receiving a similarly shaped speaker device, a convex bottom, a first sound fidelity enhancement reflex port for directing sound waves to a listening compartment, a second sound fidelity enhancement in the form of an exhaust hole for controlling sound wave pressure emanated from an enclosed speaker located within the concave body and a third sound fidelity enhancement in the form of equalizing notches that complement the exhaust hole's control of sound wave pressure emanated from an enclosed speaker.

11 Claims, 3 Drawing Sheets

PORTED AUTOMOTIVE SPEAKER ENCLOSURE APPARATUS AND METHOD

FIELD OF THE INVENTION

The present invention relates to speaker enclosures. More particularly, the present invention relates to speaker enclosures for automotive audio systems. Even more particularly, the present invention relates to speaker enclosures for automotive audio systems of the type that are provided with reflex ports for improving the audio frequency response of the audio system.

DESCRIPTION OF THE PRIOR ART

The prior art has taught that the frequency response, hence sound fidelity, of a speaker can be enhanced and be made more efficient by enclosing the speaker in some cabinet or enclosure. One method known concerns the enhancement of the sound fidelity by using a ported reflex enclosure whereby a tube is built into the cabinet that allows a certain amount of air to move in and out during operation of the cone member of the speaker. These type of speaker enclosure system results in getting a deeper bass from the system. The object of this type of enclosure is to place the low frequency vibrations in-phase with the operating speaker cone motion to achieve the enhanced sound output from the audio system. The amount of air displaced within the enclosure can vary according to the operating volume of the speaker, thus an efficient ported reflex enclosure must be tuned considering the maximum volume of the speaker in relation to the enclosure volume. The cross-sectional area and the length of the port must be factored along with the enclosure volume in tuning the enclosed speaker.

Typical of speaker enclosures that relate to the ported reflex enclosures are U.S. Pat. No. 4,284,166 that teaches a port device for improving bass-reflex speaker systems directed at preventing booming and other resonance effects and distortions by utilizing a port to factor acoustical compliance of the enclosure considering the mass of the air moving inwardly and outwardly from the enclosure. While recognizing sound fidelity enhancement resulting from controlling the air pressure within the enclosure, the patented structure does not contemplate an automotive operating environment and associated sound distribution and cooling considerations. Other ported speaker apparatus can be found in the teachings of U.S. Pat. Nos. 4,635,748, 4,398,619, 4,785,908, 4,134,471 and 4,006,311 and are similarly not directed at the automotive operating environment.

As applicant has found, the enclosure of speaker systems has bee widely addressed in quest of better sound fidelity and has generally been directed at enclosures for home entertainment use, as opposed to the automotive industry use. Generally, speaker systems for the automotive industry are installed in leftover space in the dash, door panels, side panels or are suspended in the rear trunk compartment with appropriate cut-out panels beneath the rear window area for directing the sound waves from the top of a speaker into the listening compartment. The speakers in the automotive industry are typically not enclosed in the traditional sense of an enclosure and can be considered, for all intents and purposes, a non-enclosed speaker. Because of the non-enclosed nature of the automotive speaker systems, the advantages of enhanced sound fidelity, as generally available in the home entertainment industry, are not found in automotive audio system. While custom audio systems may include means that enhance the sound fidelity of the audio systems, there are no known commercially available enclosures that can be readily installed by the average consumer over non-enclosed speakers in automobiles to achieve sound fidelity enhancements such as found in ported reflex enclosure for the home audio entertainment industry.

Therefore, a need is believed to exist for a ported reflex speaker enclosure for the automotive industry that takes advantage of the sound fidelity enhancements possible utilizing ported reflex enclosure techniques that are widely available in the home audio entertainment industry.

SUMMARY OF THE INVENTION

It is therefore a primary object of this invention to provide a ported reflex speaker enclosure for use in the automotive audio systems industry.

It is another object of the present invention to provide a ported reflex speaker enclosure that factors the audio and thermal design considerations as found in the automotive operating environment.

It is yet another object of the present invention to provide a ported reflex speaker enclosure that factors the audio and mechanical mounting considerations as found in the automobile audio systems.

It is a particular object of the present invention to provide a ported reflex speaker enclosure for six (6) by nine (9) inch speaker chassis used in automotive audio systems and typically found as non-enclosed suspended speakers in a wide wattage range in the trunk compartment of automobiles.

The present invention satisfies the foregoing objectives by providing a speaker enclosure apparatus designed to enhance an automotive audio system speaker's sound fidelity that comprises a concave body having a substantially oval shaped rim portion for receiving a similarly shaped speaker device, a convex bottom, a first sound fidelity enhancement means for directing sound waves to a listening compartment, a second sound fidelity enhancement means for controlling sound wave pressure emanated from a speaker located within said concave body and a plurality of third sound fidelity enhancement means for equalizing sound wave pressure emanated from an enclosed speaker. The concave body is designed to produce reflex sounds for the enclosed speaker and includes having a first tapered side wall integral with the rim portion, a second tapered side wall integral with the first tapered sidewall at an end opposed from the rim portion and being integral with the convex bottom to form the concave body. The interior surface of the concave body is provided with a rough surface texture to disperse the sound waves that contribute to the sound fidelity improvement of the enclosure. The reflex port is the first sound fidelity enhancement means and comprises being shaped having an elongated U-shaped notch located on one side of the rim portion. The side having the port being oriented during installation to direct sound waves from the speaker enclosure apparatus to the listening compartment. If desired, the enclosure may be rotated 180 degrees to direct the port in another direction. To help tune the speaker enclosure to deliver enhanced sound waves, the second sound fidelity enhancement means, in the form of a hole is provided at the convex bottom's apex. The interior bottom is convex to form a depression on the exterior bottom that better enables drawing air from within the trunk compartment to effect convection cooling of the speaker. As a fine tuning means for equalizing sound wave pressure within the enclosure, the plurality of third sound fidelity enhancement means are provided in the form of a plurality of perimeter disposed U-shaped notches on the rim portion. The U-shaped notches not only enable sound pressure equalization, but, also provide an entry port for electrical wiring required for speaker operation. Also, to enable easy attachment of the enclosure to a speaker, selected ones of the plurality of perimeter disposed U-shaped notches have mounting holes for receiving mating mounting hardware, such as an end of a bolt securing a speaker. The mounting holes on the U-shaped notches are disposed in a mounting hole pattern that is dimensionally larger than a pattern of the mating mounting hardware provided on a speaker. The concave body is preferably manufactured from a plastic material that will enable the rim portion to be flexed during attachment of the enclosure to the speaker to cause a momentary alignment of the mounting hole pattern with the speaker's mating mounting hardware to effect a compressed securement of said speaker within said concave body.

Therefore, to the accomplishments of the foregoing objects the invention consists of the foregoing features hereinafter fully described and particularly pointed out in the claims, the accompanying drawings and following disclosure describing in detailed the invention, such drawings and disclosure illustrating, however, but one of the various ways in which the invention may be practiced.

DESCRIPTION OF THE PREFERRED EMBODIMENT

Figure 1:
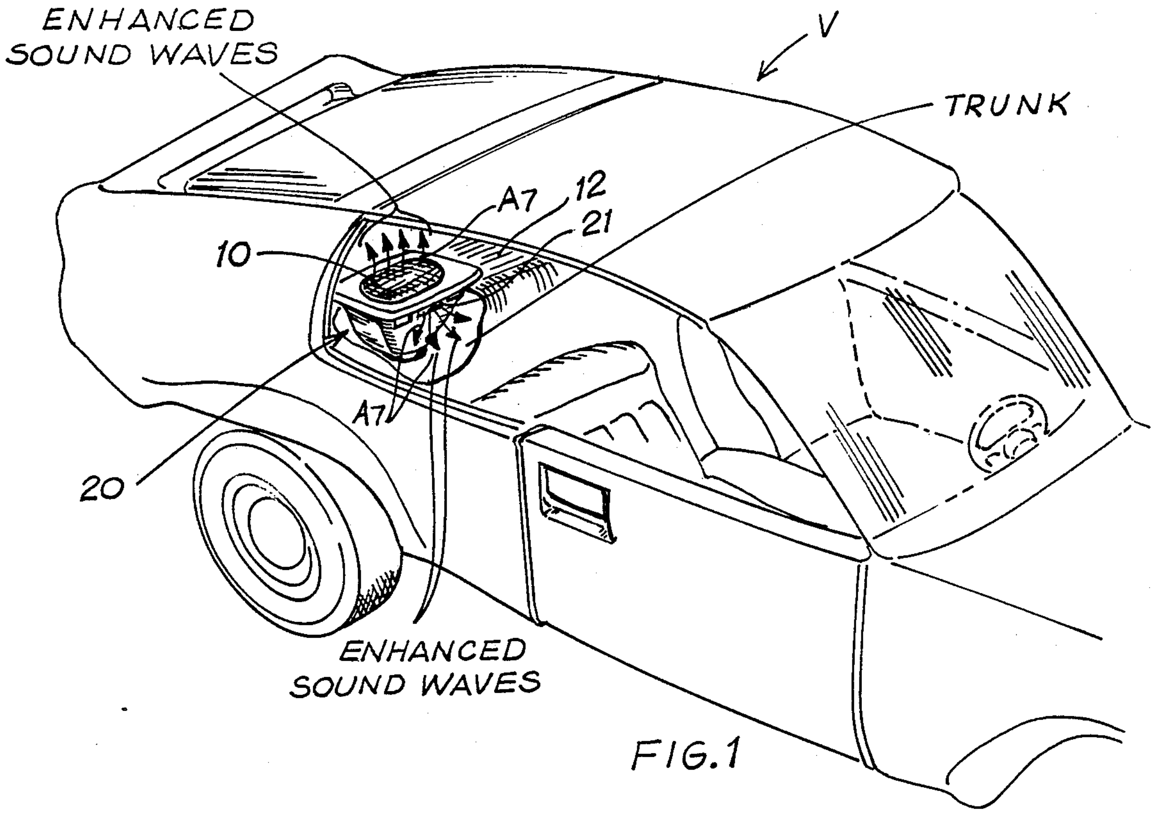
FIG. 1 is a perspective view of an automobile having a trunk compartment mounted speaker adapted with a ported reflex speaker enclosure according to the present invention.

Referring now to FIG. 1 where there is shown an automobile V having an audio system provided with a speaker 10 that is enclosed with an enclosure apparatus 20 having a reflex port 21 according to the present invention. The enclosure is preferably shaped to fit an automotive six by nine inch standard speaker chassis that can be electrically designed to wide wattage ranges and typically differ in the size of the magnet at the bottom of the cone member of the speaker.

Figure 2:
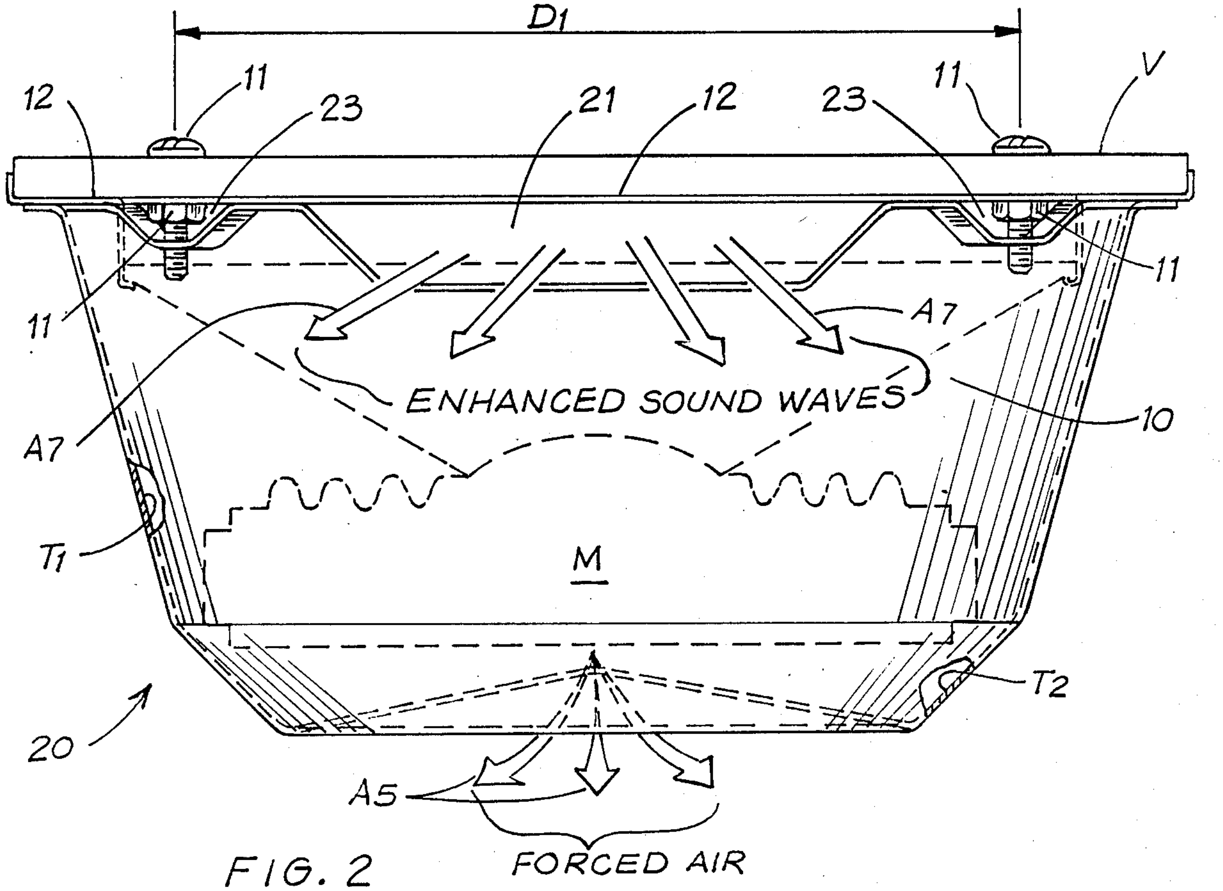
FIG. 2 is a front port end view of the present invention illustrating the mechanical mounting of an enclosed speaker that is operating to output enhanced sound waves from the first sound fidelity enhancement means and air being exhausted from the second sound fidelity enhancement means.
Figure 3:
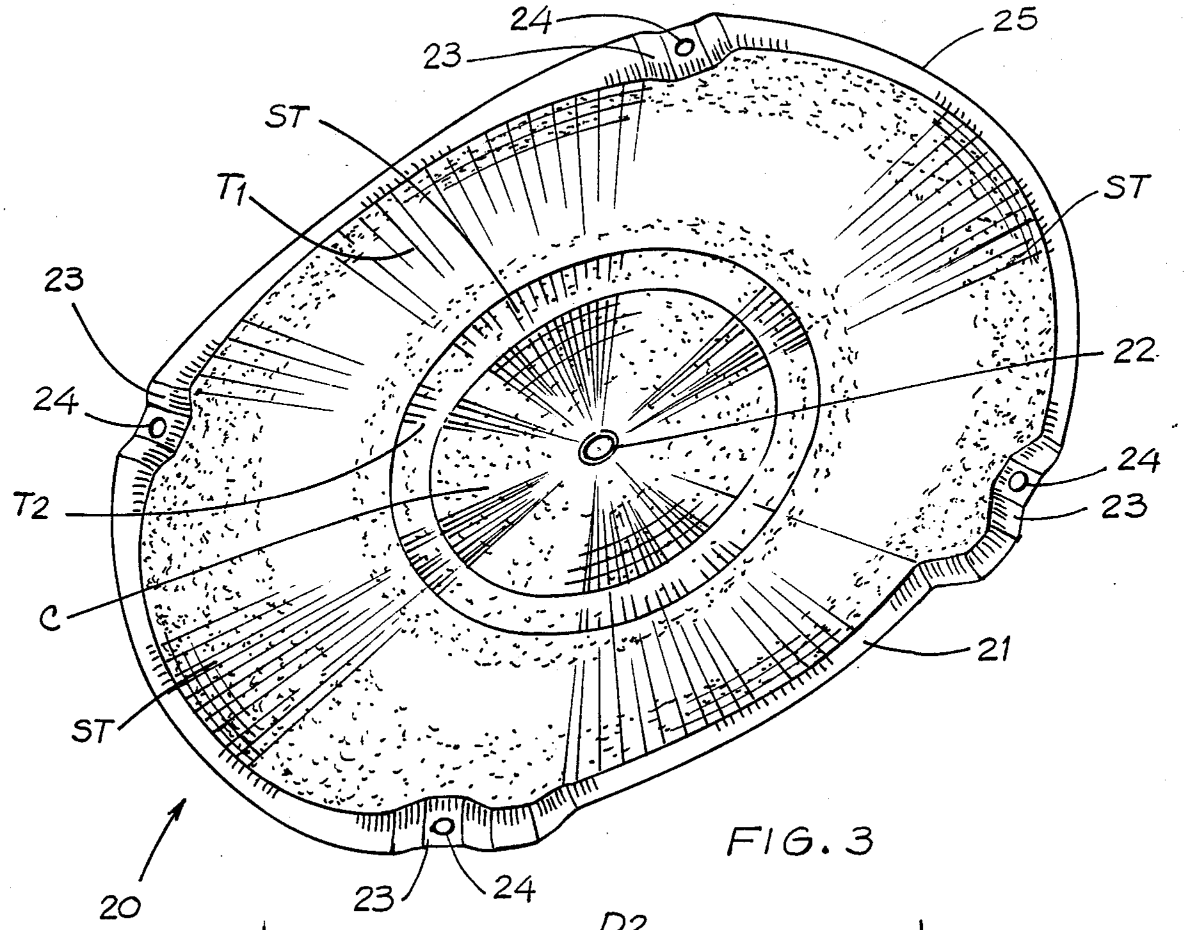
FIG. 3 is a perspective top view of the apparatus of the present invention illustrating the rim portion having the plurality of U-shaped third sound fidelity enhancement means, the elongated U-shaped first sound fidelity enhancement means, the two textured tapered walls and the textured convex bottom having the second sound enhancement means at the apex of the convex bottom.

FIG. 2 illustrates, by example, a speaker 10 mounted to a panel 12 typically provided on the rear portion of the passenger compartment beneath the rear window, which panel comprises the upper portion of a trunk compartment of most automobile. The speaker is typically mounted using hardware 11 comprising a bolt and nut arrangement having the bolt extending beyond the nut to which an enclosure, such as enclosure apparatus 20 according to present invention, can be attached. As best seen in FIG. 3 the speaker enclosure apparatus 20 is substantially a concave body having a substantially oval shaped rim portion 25 for receiving a similarly shaped speaker device, a convex bottom, designated C, a reflex port 21, termed a first sound fidelity enhancement means for directing reflex sound waves to a listening compartment, a hole 22 located on the apex of the convex bottom C, and termed a second sound fidelity enhancement means, for controlling and exhausting compressed sound wave pressure emanated from speaker 10 located within said concave body and a plurality of third sound fidelity enhancement means 23 for equalizing sound wave pressure emanated from an enclosed speaker.

Figure 4:
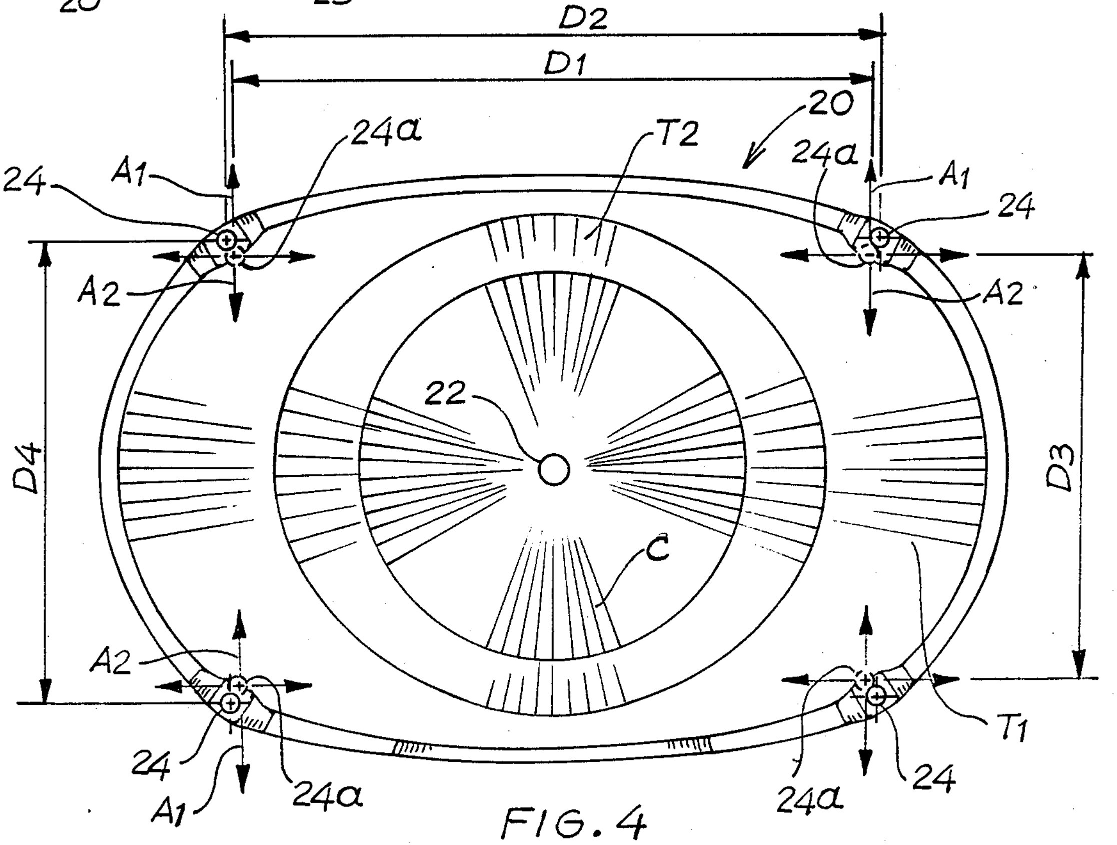
FIG. 4 is a bottom view of the present invention illustrating the flexible mounting hole pattern provided on selected ones of the U-shaped notches that enable a compressed securement of the enclosure to the speaker.
Figure 6:
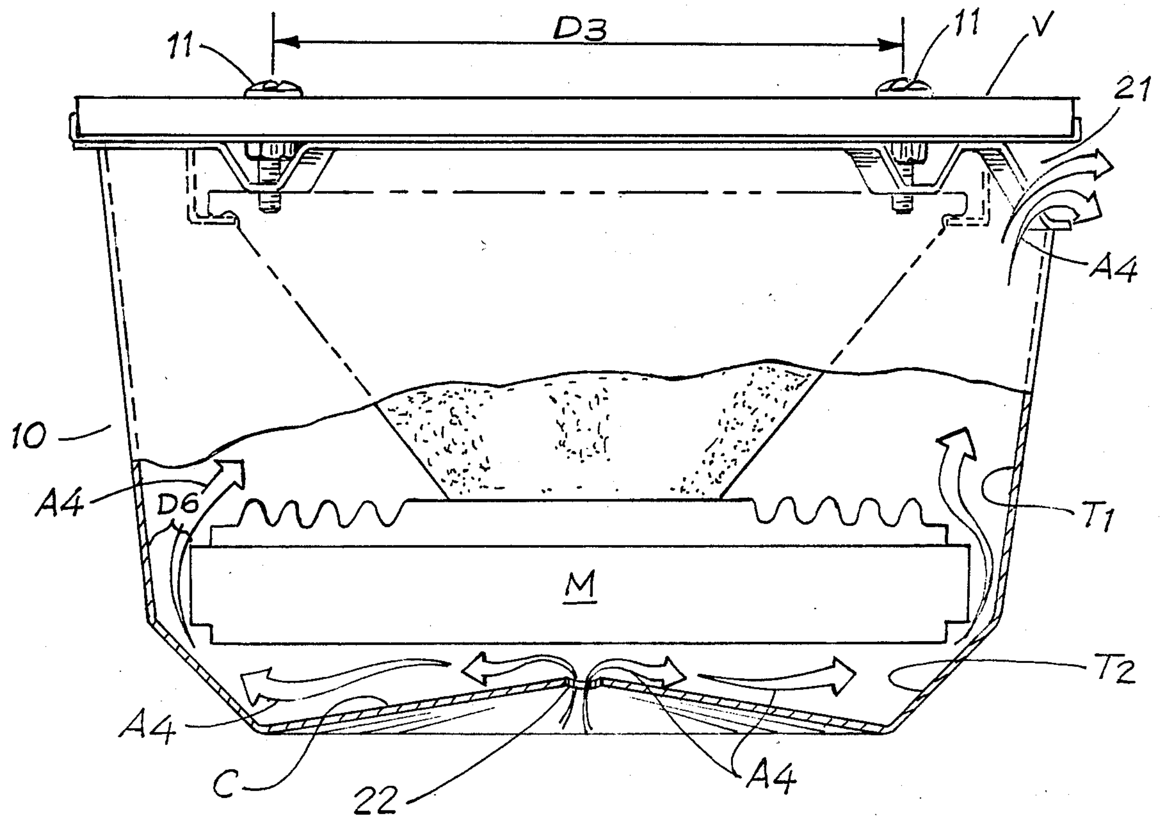
FIG. 6 is a partially sectioned side end view illustrating the convection air flow within the enclosure facilitated by the concave shaped exterior bottom.

Referring to FIGS. 2, 3 and 4, the concave body is designed to produce reflex sounds for the enclosed speaker 10 and includes having a first tapered side wall designated T1 integral with the rim portion 25, a second tapered side wall designated T2 integral with the first tapered sidewall T1 at a end opposed from rim portion 25 and being integral with the convex bottom C to form the concave body. The interior surface of the concave body is provided with a rough surface texture ST used to disperse the sound waves that contribute to the sound fidelity improvement of the enclosure. As best seen in FIG. 3, the reflex port 21 comprises being shaped having an elongated U-shaped notch located on one side of rim portion 25. The side having reflex port 21 generally being oriented during installation to direct sound waves from the speaker enclosure apparatus to the listening compartment of automobile V. If desired, the enclosure may be rotated 180 degrees to direct the port 21 in another direction if the deeper base sound are not desired to be directed into the listening compartment. As a fine tuning means for equalizing sound wave pressure within the enclosure 20, the plurality of third sound fidelity enhancement means 23 are provided in the form of a plurality of perimeter disposed U-shaped notches on the rim portion 25. The U-shaped notches not only enable sound pressure equalization, but, also provide an entry port for electrical wiring required for speaker operation (not shown). The tuning to produce the enhanced sound from the enclosed speaker is accomplished by controlling the size and shape of the first, second and third sound fidelity enhancement means. In the preferred embodiment, for a six by nine inch speaker, the reflex port 21 is an elongated U-shaped notch measuring 0.5 inch wide by 3.8 inch long bottom of notch (5.0 inch top of notch) by 0.6 inch deep, the exhaust hole 22 measuring 0.45 inches in diameter. The equalizer U-shaped notches 23 measure 0.33 inch wide by 0.33 inch long bottom of notch (0.75 inch long top of notch) by 0.33 inch deep. The interior bottom C is convex to form a depression on the exterior bottom that better enables drawing air from within the trunk compartment through hole 22 to effect convection cooling of the speaker, primarily the speaker's magnet M, as shown by arrows A6 in FIG. 6. Also, as shown in FIG. 4, to enable easy attachment of the enclosure 20 to speaker 10, selected ones of the plurality of perimeter disposed U-shaped notches 23 have mounting holes 24 for receiving matinq mounting hardware 11, typically an extended portion of a mounting bolt. The mounting holes 24 on the U-shaped notches 23 are disposed in a mounting hole pattern that is dimensionally larger than a pattern of the mating mounting hardware provided on a speaker. The concave body is preferably manufactured from a plastic material that will enable the rim portion 25 to be flexed, as shown by arrow A1, A2, A3 and A4 during attachment of the enclosure to the speaker to cause a momentary alignment, shown as hole **24*a*, of the mounting hole pattern with the speaker's mating mounting hardware to effect a compressed securement of said speaker within said concave body. In the preferred embodiment, the hole pattern dimensioning for holes 24 and 24*a* relate such that dimension D2 is greater than D1 bt 0.045 inches and dimension D4 is greater than D3 by 0.045 inches, see FIGS. 2 and 6** for the speaker mounting dimensions D1 and D3.

Figure 5:
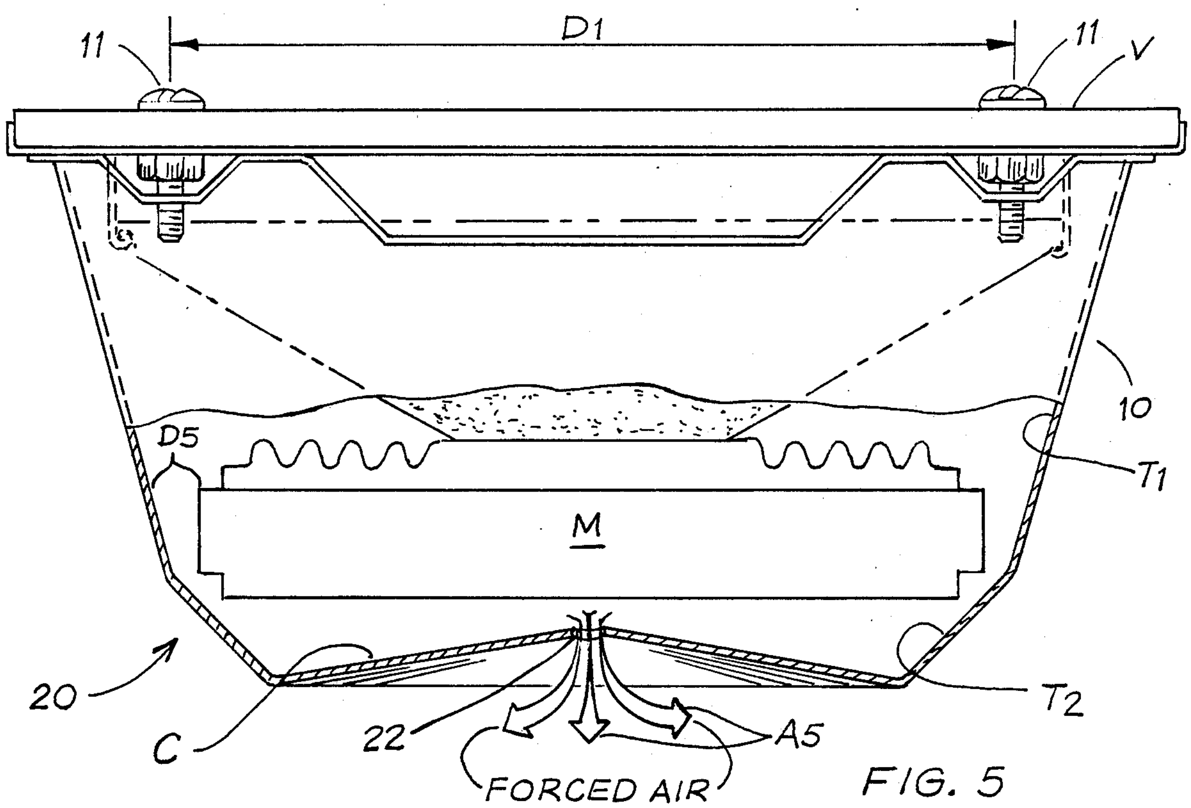
FIG. 5 is a partially sectioned view, similar to FIG. 2, further illustrating the enclosed speaker mounting, the tapered walls and the convex bottom having a hole for exhausting compressed sound wave air.

Referring to FIGS. 2 and 5, an enclosed operating speaker 10 can generate sound waves within the enclosure 20 that compresses the air within the volume of the enclosure 20. The arrangement produces enhanced sound waves A7 at reflex port 21 by controlling the amount of compressed air being exhausted out hole 22 as shown by arrow A5. The notches 23 disposed on rim 25 equalize the exhausted compressed air and complement the amount of compressed air being exhausted out hole 22. Collectively, hole 22 and notches 23 control the back pressure on the speaker's cone member to optimize cone movement to match low frequency vibrations.

Therefore, while the present invention has been shown and described herein in what is believed to be the most practical and preferred embodiments, it is recognized that departures can be made therefore within the scope of the invention, which is therefore not to be limited to the details disclosed therein but is to be accorded the full scope of the claims so as to embrace any and all equivalent apparatus.

I claim:

1. A speaker enclosure apparatus for enclosing a speaker having a flexible cone member of an audio system and enhancing sound fidelity of said audio system, said apparatus comprising:

a concave body having a rim portion and a convex bottom;

first sound fidelity enhancement means for directing sound waves to a listening compartment, said first sound fidelity enhancement means comprising an open duct port disposed on said rim portion;

second sound fidelity enhancement means for controlling movement of said cone member of said speaker, said second sound fidelity enhancement means comprising an opening at an apex of said convex bottom that controls compressed air being exhausted from said concave body and corresponding to back pressure on said cone member that controls movement of said cone member, said opening also enabling convection cooling of said speaker; and a plurality of third sound fidelity enhancement means for equalizing sound wave pressure emanated from said speaker, said plurality of third sound fidelity enhancement means comprises a plurality of perimeter disposed U-shaped notches on said rim portion adjacent said first sound fidelity enhancement means.

2. A speaker enclosure apparatus as recited in claim 1 wherein said concave body includes having:

a first tapered side wall integral with said rim portion;

a second tapered side wall, said second tapered side wall being integral with said first tapered sidewall at an end opposed from said rim portion, said second tapered side wall being integral with said convex bottom.

3. A speaker enclosure apparatus as recited in claim 1 wherein:

said concave body has a first tapered side wall integral with said rim portion, a second tapered side wall, said second tapered side wall being integral with said first tapered sidewall at an end opposed from said rim portion, said second tapered side wall being integral with said convex bottom, said concave body having an inner surface finish consisting of a pebble texture.

4. A speaker enclosure apparatus for enclosing a speaker having a flexible cone member of an audio system and enhancing sound fidelity of said audio system, said apparatus comprising:

a concave body having a rim portion and a convex bottom, said concave body having a first tapered side wall integral with said rim portion, a second tapered side wall, said second tapered side wall being integral with said first tapered sidewall at an end opposed from said rim portion, said second tapered side wall being integral with said convex bottom;

first sound fidelity enhancement means for directing sound waves to a listening compartment, said first sound fidelity enhancement means comprising an open duct port disposed on said rim portion;

second sound fidelity enhancement means for controlling movement of said cone member of said speaker, said second sound fidelity enhancement means comprising an opening at an apex of said convex bottom that control compressed air being exhausted from said concave body and corresponding to back pressure on said cone member that controls movement of said cone member, said opening also enabling convection cooling of said speaker; and a plurality of third sound fidelity enhancement means for equalizing sound wave pressure emanated from said speaker, said plurality of third sound fidelity enhancement means comprising a plurality of perimeter disposed U-shaped notches on said rim portion adjacent said first sound fidelity enhancement means.

5. A speaker enclosure apparatus as recited in claim 4 wherein:

said duct port being shaped to define a horizontally elongated, U-shaped notch located on one side of said rim portion, said one side being oriented to direct sound waves from said speaker enclosure apparatus to said listening compartment.

6. A speaker enclosure apparatus as recited in claim 4 wherein:

said concave body being sized for enclosing a six inch by nine inch speaker.

7. A speaker enclosure apparatus as recited in claim 4 wherein:

selected ones of said plurality of perimeter disposed U-shaped notches having mounting hole for receiving mating mounting hardware on said speaker.

8. A speaker enclosure apparatus as recited in claim 7 wherein:

said mounting holes being disposed in amounting hole pattern that is dimensionally larger than a mounting hardware pattern of said mating mounting hardware, said concave body being formed from a plastic material that enables flexing of said rim portion during attachment of said speaker enclosure that effects a momentary alignment of said mounting hole pattern with said mating mounting hardware to effect a compressed securement of said speaker within said concave body.

9. A method of enhancing sound fidelity of an audio speaker having a flexible cone member, said method comprising the steps of:

(a) selecting a speaker enclosure apparatus, said speaker enclosure apparatus comprising:

a concave body having a rim portion and a convex bottom, first sound fidelity enhancement means for directing sound waves to a listening compartment, said first sound fidelity enhancement means comprising an open duct port disposed on said rim portion, second sound fidelity enhancement means for controlling movement of said cone member of said speaker, said second sound fidelity enhancement means comprising an opening at an apex of said convex bottom that controls compressed air being exhausted from said concave body and corresponding to back pressure on said cone member that controls movement of said cone member, said opening also enabling convection cooling of said speaker, and a plurality of third sound fidelity enhancement means for equalizing sound wave pressure emanated from said speaker, said plurality of third sound fidelity enhancement means comprises a plurality of perimeter disposed U-shaped notches on said rim portion adjacent said first sound fidelity enhancement means;

(b) enclosing said speaker within said selected speaker enclosure apparatus;

(c) operating said speaker and producing sound waves and associated compressed air within said concave body; and (d) controlling movement of said cone member by means of controlling exhausting of said compressed air through said opening, said compressed air acting on said cone member to control movement and thereby enhance sound fidelity of said operating speaker.

10. A method of enhancing sound fidelity of an audio speaker as recited in claim 9, further including the step of:

equalizing said compressed air pressure acting on said speaker cone member by means of further exhausting said compressed air utilizing said plurality of third sound fidelity enhancement means.

11. A speaker enclosure apparatus for enclosing a speaker having a flexible cone member of an audio system and enhancing sound fidelity of said audio system, said apparatus comprising:

a concave body having a rim portion and a convex bottom;

first sound fidelity enhancement means for directing sound waves to a listening compartment, said first sound fidelity enhancement means comprising an open duct port disposed on said rim portion;

second sound fidelity enhancement means for controlling movement of said cone member of said speaker, said second sound fidelity enhancement means comprising an opening at an apex of said convex bottom that controls compressed air being exhausted from said concave body and corresponding to back pressure on said cone member that controls movement of said cone member, said opening also enabling convection cooling of said speaker.

* * * * *

UNITED STATES PATENT AND TRADEMARK OFFICE
CERTIFICATE OF CORRECTION

PATENT NO. : 4,928,788

DATED : May 29, 1990

INVENTOR(S) : Jon B. Erickson

It is certified that error appears in the above-identified patent and that said Letters Patent is hereby corrected as shown below:

In claim 8, line 3 after "disposed in" delete "amounting" and insert therefor --a mounting--.

Signed and Sealed this

Thirteenth Day of August, 1991

*Attest:*

HARRY F. MANBECK, JR.

*Attesting Officer*

*Commissioner of Patents and Trademarks*